United States Patent
Sato et al.

(10) Patent No.: US 6,376,796 B2
(45) Date of Patent: Apr. 23, 2002

(54) PLASMA PROCESSING SYSTEM

(75) Inventors: Noriyoshi Sato, 4-17-113, Kadan, Aoba-ku; Satoru Iizuka, 6-5-10-201, Koriyama; Tsukasa Yoneyama, 12-17, Aza Kodaira, Hukurohara, both of Taihaku-ku; Hiroyasu Sato, 2-1-5, Aoyama, Taihaku-ku, all of Sendai-shi, Miyagi-ken; Unryu Ogawa; Yoshio Tominaga, both of Tokyo; Yoichiro Numazawa, Machida; Yukito Nakagawa, Tachikawa, all of (JP)

(73) Assignees: Noriyoshi Sato; Satoru Iizuka; Tsukasa Yoneyama; Hiroyasu Sato, all of Sendai; Anelva Corporation; Hitachi Kokusai Electric, Inc., both of Tokyo, all of (JP)

( * ) Notice: Subject to any disclaimer, the term of this patent is extended or adjusted under 35 U.S.C. 154(b) by 0 days.

(21) Appl. No.: 09/738,989

(22) Filed: Dec. 19, 2000

(30) Foreign Application Priority Data

Dec. 20, 1999 (JP) .......................................... 11-360929

(51) Int. Cl.$^7$ ................................................ B23K 9/02
(52) U.S. Cl. ............................ 219/121.43; 219/121.36; 373/25
(58) Field of Search ....................... 219/121.41, 121.43, 219/121.59, 121.11, 121.36, 121.39, 121.4; 204/298.18, 298.19, 298.37, 298.38; 156/345; 118/723 MN, 723 I, 723 E; 373/18, 25

(56) References Cited

U.S. PATENT DOCUMENTS 6,033,481 A * 3/2000 Yokogawa et al. ......... 118/723
6,034,346 A * 3/2000 Yoshioka et al. ...... 219/121.43
6,051,114 A * 4/2000 Yao et al. ................ 204/192.3

FOREIGN PATENT DOCUMENTS

| JP | 06-325899 | 11/1994 |
| JP | 09-19901 | 7/1997 |

OTHER PUBLICATIONS

Sato et al., "Uniform Plasma Produced by a Plane Slotted Antenna With Magnets For Electron Cyclotron Resonance" Appl. Phys. Lett., 62 (1993) 1469.

* cited by examiner

Primary Examiner—Tu Ba Hoang
(74) Attorney, Agent, or Firm—Oliff & Berridge, PLC

(57) ABSTRACT

A plasma processing system provided with a vacuum chamber for accommodating a substrate and for generation of plasma in a space in the front of the same, an antenna provided at the vacuum chamber, and a high frequency power source for supplying high frequency power to the antenna. The antenna emits high frequency power, generates plasma inside the vacuum chamber, and processes the surface of the substrate by the plasma. In the plasma processing system, the antenna has a disk-shaped conductor plate having a predetermined thickness. A coaxial waveguide having a folded portion is formed around the disk-shaped conductor plate. The folded portion of the waveguide is provided with a short-circuit 3 dB directional coupler having an impedance matching function. The antenna having the above structure prevents the generation of a standing wave in the high frequency wave propagation path from the high frequency power source to the vacuum chamber and generates high density plasma by supply of a large power. Due to this, processing of a large area substrate becomes possible.

9 Claims, 7 Drawing Sheets

PLASMA PROCESSING SYSTEM

BACKGROUND OF THE INVENTION

1. Field of the Invention

The present invention relates to a plasma processing system, and more particularly, relates to an antenna supplying a large power and useful for generation of high density plasma without causing any loss and a plasma processing system efficiently generating high density plasma using the antenna and performing predetermined processing on the surface of a substrate.

2. Description of the Related Art

Among the systems for performing predetermined processing on the surface of a semiconductor wafer or liquid crystal substrate (hereinafter referred to as a "substrate") using plasma, plasma enhanced chemical vapor deposition (PCVD) and plasma etching systems are widely known. In these plasma processing systems, it is necessary to generate high density plasma in order to increase the processing rate. In addition, from the viewpoint of preventing impurities, it is required to form high density plasma by a lower pressure.

To generate plasma for the surface processing, from the viewpoint of obtaining high density plasma with a high efficiency, a system using the gaseous discharge generated by high frequency power is used. The inventors of the present patent application have already proposed a plasma processing system of a type supplying a high frequency power of 2.45 GHz to a radial slotted antenna connected to a coaxial high frequency power feed system to generate plasma (Japanese Patent No. 8-2534219) and have confirmed that good plasma processing was possible (as document, see for example N. Sato et al., "Uniform Plasma Produced by a Plane Slotted Antenna With Magnets For Electron Cyclotron Resonance" for the configuration of a plasma processing system using a slotted antenna shown in the above document. This plasma processing system has a vacuum chamber 102 provided with an evacuating mechanism 101 and generating a discharge inside for generation of plasma, an antenna device 104 arranged on the upper section of the vacuum chamber 102 and provided with a slotted antenna 103, a high frequency wet-feed system 105 for feeding high frequency power to the slotted antenna 103, a discharge gas introduction mechanism 105 for introducing a discharge gas into the vacuum chamber 102, and a substrate holder 107 arranged at a lower position inside the vacuum chamber 102. A substrate 108 is loaded on the substrate holder 107 as an object to be processed. The shape of the slots (or slits) formed in the slotted antenna 103 is explained in detail in the above-mentioned patent specification or document. The slotted antenna 103 is actually provided with a magnetic circuit formed by permanent magnets etc. for generating a magnetic field near the electromagnetic wave emitter 103a, but in FIG. 9, its illustration is omitted. Further, as a result of the addition of the magnetic circuit, the slotted antenna 103 originally to be produced as the disk-shaped conductor plate is actually produced as a conductor having a predetermined thickness being able to house a magnetic circuit. In FIG. 9, however, for convenience of explanation, it is shown as a plate material. The high frequency power feed system 104 supplying the high frequency power is comprised of a high frequency power source 111, a stub tuner 112, a coaxial waveguide converter 113, a coaxial line 114, and a coaxial vacuum window 115.

The substrate 108 loaded on the substrate holder 107 is arranged to face the electromagnetic wave emitter 103a in the slotted antenna 103.

In the plasma processing system shown in FIG. 9, the vacuum chamber 102 is evacuated by the evacuating mechanism 101, discharge gas is introduced into the vacuum chamber 102, and a predetermined high frequency power is supplied to the slotted antenna 103 by the high frequency power feed system 105. The introduced discharge gas starts to discharge by the high frequency wave emitted from the electromagnetic wave emitter 103a of the slotted antenna 103 and generates plasma in the space in front of the substrate 108 in the vacuum chamber 102. The surface of the substrate 108 is processed by the physical or chemical action of the generated plasma. For example, if gas having an etching action is introduced as the discharge gas, the surface of the substrate 108 is etched.

Note that in the above-mentioned related art, an industrial frequency of 2.45 GHz is used as the frequency of the high frequency power. Further, the flux density of the magnetic field generated near the antenna by the magnetic circuit, corresponding to the high frequency, is set to be larger than about 875 Gauss so that the frequency of the electron cyclotron becomes equal to 2.45 GHz.

In the field of art of general antennas for transmitting an electromagnetic wave of the microwave to the millimeter wave band, conventionally, the folded waveguide proposed In Japanese Unexamined Patent Publication (Kokai) No. 9-199901 is known. This folded waveguide was proposed to solve the problem of the conventional folded waveguide shown in FIG. 14 of Japanese Unexamined Patent Publication (Kokai) No. 9-199901, that is, the need for formation of reflection surfaces of 45 degrees cuts at the top and bottom of the folded ends and the attachment of adjustment screws for canceling out reflection waves at the reflection surfaces and the resultant complexity of the configuration, the requirement for high dimensional precision, the high cost and inability of mass production, the narrow band of the frequency characteristics, and the troublesome adjustment work. Therefore, the folded waveguide proposed in Japanese Unexamined Patent Publication (Kokai) No. 9-199901 is characterized, as defined for example in claim 1 and claim 2, by setting an "h" satisfying predetermined conditions in the dimensions a×h (shown in FIG. 1) of the opening window of the 180 degrees folded portion.

In general the substrates processed by plasma processing systems have become larger in size in recent years. In the process of production of an LSI by processing of a silicon substrate, it is necessary to fabricate a large number of devices from a single substrate, so the size of substrates have become larger. Therefore, the above-mentioned plasma processing systems have been required to be increased in the power of the high frequency wave supplied in order to make the area of the plasma generation region (area of plane parallel to the substrate) larger and to make the plasma density higher for increasing the processing rate.

The antenna device 104 comprised of the above slotted antenna 103 is predicated on the processing of a substrate of a diameter of about 200 mm using plasma of a density of $10^{11}$ cm$^{-3}$ or so generated by the supply of a high frequency power of about 1 kW. Therefore, it is not possible to supply a large power high frequency wave outside of this assumption and therefore not possible to generate high density plasma suited to the processing of a large area substrate. The reason why a large power high frequency wave cannot be supplied is that a standing wave is generated due to the mismatch of the impedance at the high frequency wave propagation path formed in the slotted antenna 103 and therefore a locally strong electrical field is generated and causes insulation breakdown. Further, the electrical field induced in the slotted antenna 103 due to the standing wave becomes large and the surface of the slotted antenna 103 is heated by the Joule effect resulting in a loss of power which in turn obstructs the realization of a higher density plasma. In this slotted antenna, it is generally impossible to avoid mismatch of impedance arising due to the discontinuity in the shape of the high frequency wave propagation path.

Further, according to the technology disclosed in Japanese Unexamined Patent Publication (Kokai) No. 9-199901 explained above, it is made possible to match the impedance without adjustment in the folded waveguide of a low loss transmission line of an electromagnetic wave of the microwave to the millimeter wave band and thereby eliminate the reflection wave and thus eliminate the standing wave. This technology, however, is limited to a folded waveguide comprised of the wide area surface of a rectangular waveguide folded substantially 180 degrees. When the width of the wide area surface is made "a" and the width of the narrow wall surface is "b", these dimensions "a" and "b" may be used to give conditions for eliminating the standing wave. Therefore, this technology mainly relates to the structure of the folded portion of a rectangular waveguide and does not relate to an antenna structure. Further, the above publication alludes to a folded radial waveguide (circular waveguide) in its eighth embodiment (FIG. 12 and paragraph 0049 etc.) and claims 12 and 13 as a modification of a folded waveguide. In this case, the folded radial waveguide uses 2πr ("r" being the distance from the center of the radial waveguide 61 to the center position of the opening of the folded waveguide 64) as the value corresponding to the width "a" of the wide area surface. It is possible to realize a plane array antenna using the folded radial waveguide, but this is only a modification of the folded waveguide satisfying the predetermined conditions in the end.

In particular, in an antenna used in the above plasma processing system, since a magnetic circuit is provided for forming a magnetic field of a predetermined distribution in the plasma generation space, in actuality a space for accommodating the magnetic circuit is provided and a disk-shaped conductor having a predetermined thickness is used. When using the antenna comprised of the disk-shaped conductor having the above thickness to supply a high frequency power into the vacuum chamber for the processing of the substrate, it is extremely difficult to have the most suitable impedance matching. For the impedance matching and efficient propagation of a high frequency wave without causing a standing wave, a new concept of antenna design suitable for the type and structure of the antenna is required.

SUMMARY OF THE INVENTION

An object of the present invention is to make improvements to the structure of a plasma generation antenna comprised mainly of a disk-shaped conductor having a predetermined thickness and provided with an electromagnetic emitter, while proposing an innovative antenna design technique, and thereby provide an antenna able to prevent the generation of a standing wave in a high frequency wave propagation path and generate high density plasma by the supply of a large power.

Another object of the present invention is to provide a plasma processing system being able to use the antenna to supply a large power high frequency wave, generating high density plasma by a large power, and processing the surface of a large area at a high rate.

The plasma processing system according to the present invention is configured as follows so as to achieve the above objects.

The plasma processing system of the present invention has, as a presupposition configuration, a vacuum chamber in which plasma is generated in a space at the front of a substrate arranged therein, an antenna for plasma generation provided in the vacuum chamber, and a high frequency power source for supplying high frequency power to the antenna. The antenna supplied with the high frequency power from the high frequency power source emits the high frequency power to cause generation of plasma in the space in the vacuum chamber. The plasma is used to perform predetermined processing of the surface of the substrate. Further, in the plasma processing system, the antenna has a disk-shaped conductor having a predetermined thickness and an electromagnetic emitter facing the substrate. It is connected to the high frequency power source by a coaxial line or cable. The disk-shaped conductor is connected to an inside conductor of the coaxial line at its center point. A waveguide of a coaxial type arranged symmetrically with respect to the center point and provided with a folded portion from the coaxial line to the electromagnetic emitter is provided around the disk-shaped conductor. The folded portion of the waveguide is structured as a short-circuit 3 dB directional coupler for impedance matching.

The above-mentioned plasma processing system has a radial waveguide including the disk-shaped conductor having the predetermined thickness due to housing a magnetic circuit and including the folded portion around it. The high frequency power supplied from the top side of the disk-shaped conductor is propagated to the electromagnetic wave emitter at the bottom side through the radial waveguide and is emitted from the electromagnetic wave emitter to the space inside the vacuum chamber. In the antenna having this structure, the waveguide is given the structure of a short-circuit 3 dB directional coupler. This is used for impedance matching to prevent generation of a standing wave.

Among antennas for supply of the high frequency power used in plasma processing systems, there has never before been an antenna having a disk-shaped conductor having a predetermined thickness which can perform impedance matching. According to the present invention, structure enabling impedance matching is realized by this new antenna design technique.

In the plasma processing system according to the present invention, preferably the structure of a short-circuit 3 dB directional coupler is obtained by forming a step difference at one or both of the top surface and bottom surface of the disk-shaped conductor. The disk-shaped conductor having a three-dimensional shape forms a waveguide with the external chamber. The antenna is provided at, for example, the top of the vacuum chamber used as the processing chamber. The high frequency propagation conditions of the waveguide having the folded portion are changed by the formation of the step difference. The structure of the short-circuit 3 dB directional coupler is realized by providing a step difference meeting predetermined conditions regarding the three-dimensional shape of the disk-shaped conductor. Impedance is matched by the waveguide.

Further, in the above configuration, the structure of a short-circuit 3 dB directional coupler is given by providing a plurality of dielectric materials in the region of the waveguide formed around the disk-shaped conductor divided into for example smaller regions and adjusting the heights or dielectric constants of the dielectric materials to satisfy predetermined conditions.

Further, In the above antenna, the variables (dimensions, dielectric constant, etc. of parts) of any elements in the plurality of elements comprising that structure of a short-circuit 3 dB directional coupler are determined to give $S_{22}=\Gamma_A{}^*$ (where "*" is a conjugated complex number) in the representation of the scattering matrix with respect to the reflection coefficient $\Gamma_A$ of the antenna. This condition is one example of the predetermined conditions. There are various elements determining the scattering matrix in the above plurality of elements. Further, similarly, in the antenna, the variables of any elements in the plurality of elements comprising the structure of the short-circuit 3 dB directional coupler are determined to give $S_{22}=0$ in the representation of the scattering matrix. This condition is another example of the predetermined conditions and is a basic condition with high practicality.

The plasma processing system according to the present invention is preferably provided with a magnetic circuit for generating a magnetic field in the space inside the disk-shaped conductor. By providing the magnetic circuit, the disk-shaped conductor is given a predetermined thickness. Since the disk-shaped conductor has the predetermined thickness, a new unique technique for antenna design or impedance matching is provided.

In the above configuration, the flux density of the magnetic field generated by the magnetic circuit in the region in proximity to the disk-shaped conductor In the space of the vacuum chamber is set so that the electron cyclotron frequency corresponding to the flux density becomes higher than the frequency of the high frequency power.

Further, in the above configuration, the frequency of the high frequency power is 0.5 to 10 GHz.

In the plasma processing system according to the present invention, preferably a coaxial type impedance matching mechanism is provided at the coaxial line connected to the antenna.

Note that in the above explanation, the explanation was made focusing on a plasma processing system provided with the new high frequency feed antenna, but the antenna itself is also highly valuable technically.

The present invention exhibits the following effects. It provides the plasma processing system supplying a high frequency power into the vacuum chamber to cause discharge and generate plasma and thereby process the surface of a substrate, when the disk-shaped conductor supplying high frequency power has the predetermined thickness, the waveguide surrounding the disk-shaped conductor is given the structure of a short-circuit 3 dB directional coupler. Thereby the generation of a standing wave can be prevented, the high frequency power can be transmitted efficiently, and the efficiency of plasma generation can be improved. Therefore, a large power high frequency wave can be supplied, a high density plasma can be generated, and the surface of a substrate of a diameter more than 300 mm can be processed. Further, according to the present invention, the effect is more remarkable when using discharge resulting from a high frequency power with a frequency in the range of 0.5 to 10 GHz to generate plasma with a good uniformity over a large area. It is possible to improve the practicality of the plasma processing system when processing a large area substrate by high frequency discharge.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Next, preferred embodiments of the present invention will be explained with reference to the attached drawings.

The plasma processing system according to the present invention is in general used for a dry etching system, plasma CVD system, etc. In the following explanation of the embodiments, a dry etching process for fabrication of an LSI is envisioned. The present invention aims at the improvement of the plasma generation mechanism including an antenna. Its applications are not however limited to a dry etching process.

Figure 1:
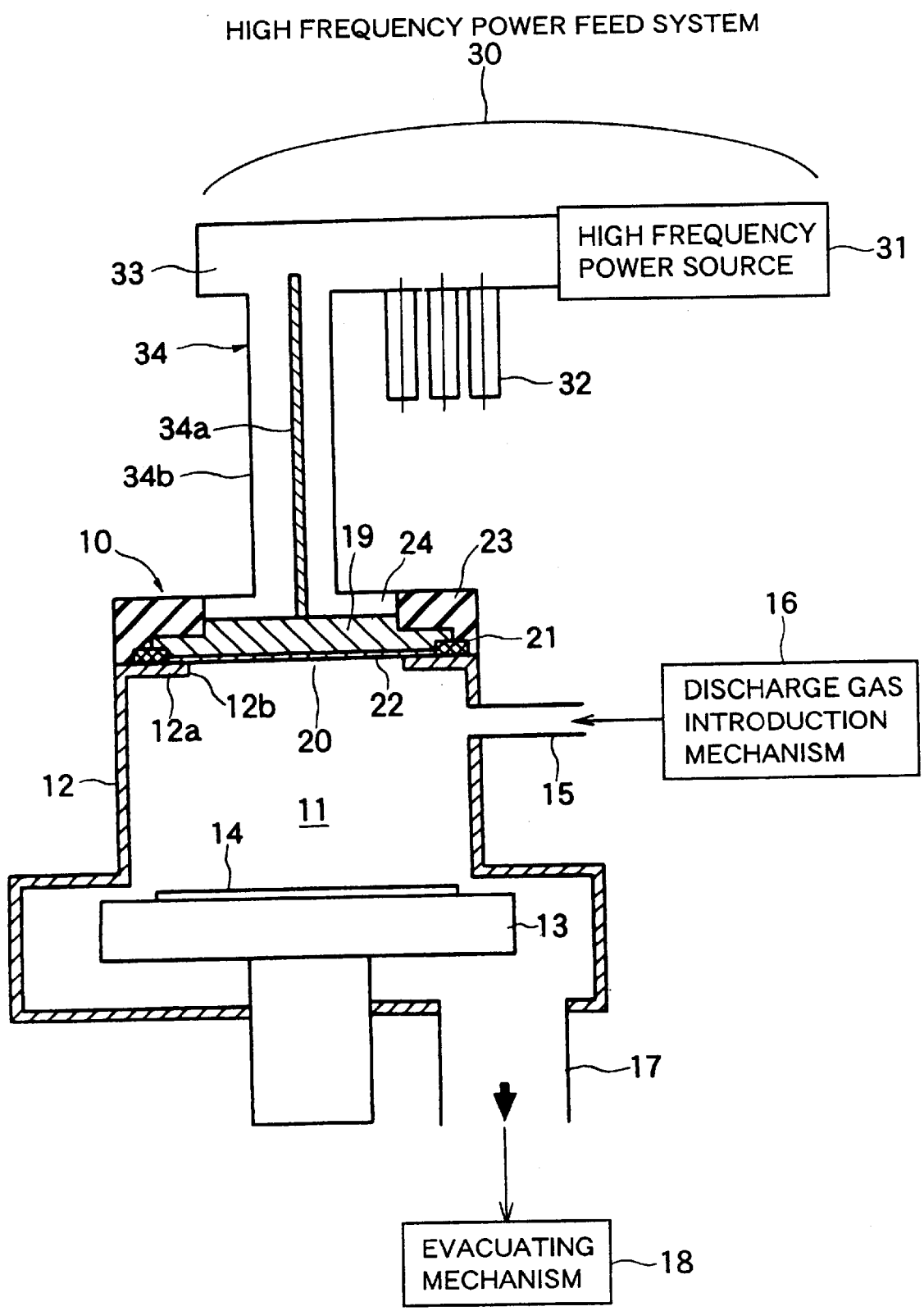
FIG. 1 is a longitudinal sectional view of a plasma processing system according to a first embodiment of the present invention.

FIG. 1 shows a plasma processing system provided with an antenna as a characteristic part of the present invention. Reference numeral 10 is a plasma generation antenna. In the plasma processing system according to the present invention, the characteristic part lies in the improved structure of the antenna 10. Therefore, according to this embodiment, the explanation will be made of mainly the structure and action of the antenna 10 referring to the drawings, The overall structure of the plasma processing system is drawn schematically.

The antenna 10 is provided at the top side of a vacuum chamber 12 having a space 11 for generation of plasma inside it. At the bottom part of the inside of the vacuum chamber 12 is provided a substrate holder 13 arranged so as to face the antenna 10. On the top surface of the substrate holder 13 is loaded a substrate 14 to be processed. The substrate 14 is for example a large sized substrate with a large area having a diameter of 300 mm. The substrate 14 is held horizontally in the figure. The processed surface of the substrate 14 is brought close to the space. The space 11 between the antenna 10 and the substrate holder 13 is a region of generation of plasma. The top surface of the substrate 14 faces the antenna 10 across this space 11.

In the plasma processing system according to the present embodiment, a gas introduction pipe 15 is provided at a cylindrically shaped surrounding wall of the vacuum chamber 12. The gas introduction pipe 15 is connected to a discharge gas introduction mechanism 16 through a valve etc. The discharge gas is introduced into the space 11 in the vacuum chamber 12 through the gas introduction pipe 15. Under the substrate holder 13 arranged at the bottom of the vacuum chamber 12 is formed an evacuation port 17. The evacuation port 17 is connected to an evacuating mechanism 18. The inside of the vacuum chamber 12 is held at a required reduced pressure state by the evacuating mechanism 18. When electrical power is supplied to the discharge gas of the vacuum chamber 12 in this state, discharge is started and plasma is generated. The antenna 10 is provided at its approximate center position with a disk-shaped conductor plate 19 in a horizontal state in the figure. The power for generation of the plasma is supplied as high frequency power from an electromagnetic wave emitter 20 provided at the bottom surface of the disk-shaped conductor plate 19. The high frequency power Is supplied from a high frequency power feed system 30 to the disk-shaped conductor plate 19 of the antenna 10. The disk-shaped conductor plate 19 houses a magnetic circuit near the electromagnetic wave emitter 20, so has a predetermined thickness. Therefore, the disk-shaped conductor plate 19 is actually formed as a disk-shaped conductor having an inside volume. The thickness of the disk-shaped conductor plate 19 is determined in accordance with the magnitude etc. of the magnetic circuit housed.

In the antenna 10, the above-mentioned disk-shaped conductor plate 19 is attached at a location outside the opening 12b of the ceiling 12a of the discharge vacuum chamber 12, so as to plug the same, through a ring 21 made of a dielectric functioning also to seal the vacuum. At the bottom surface of the disk-shaped conductor plate 19, the part through the opening 12b facing onto the space 11 inside the vacuum chamber 12 forms the above-mentioned electromagnetic wave emitter 204 Also, a thin dielectric plate 22 is attached to the bottom surface of the disk-shaped conductor plate 19. Further, at the surrounding regions at the upper side, side directions, and lower side of the disk-shaped conductor plate 19 is provided a portion 24 forming a high frequency propagation path, that is, a waveguide 24. The waveguide 24 is formed as a coaxial high frequency wave propagation path around the disk-shaped conductor plate 19 between the conductor plate 19 and an outside vessel and has a folded portion. Further, around the upper peripheral edge of the disk-shaped conductor plate 19 is provided a ring 23 made of a dielectric in the waveguide 24. The outer shape of the peripheral edge of the disk-shaped conductor plate 19 forming the waveguide 24 at its inside portion or the structure of the waveguide 24 formed using a dielectric material such as the dielectric rings 21 and 23 and the method of design of the same are the most important points in the present invention.

Further, the above high frequency power feed system 30 is comprised of a high frequency power source 31, a stub tuner 32, a coaxial waveguide converter 33, and a coaxial line 34. The stub tuner 32 is comprised of three coaxial tuners and is arranged in a waveguide. Further, the coaxial line 34 is comprised of an inner conductor 34a and a tubular outer conductor 34b. The inner conductor 34a of the coaxial line 34 is connected to the center of the top surface of the disk-shaped conductor plate 19, while the bottom end of the outer conductor 34b of the coaxial line 34 is connected to the outside portion of the waveguide 24. The bottom end of the coaxial line 34 is connected to the top side of the waveguide 24. Further, the folded portion of the waveguide 24 is formed as a portion extending from the bottom end of the coaxial line 34 to the electromagnetic wave emitter 20 at the bottom side of the disk-shaped conductor plate 19.

The disk-shaped conductor plate 19 houses a magnetic circuit, or is provided additionally with the magnetic circuit, or assembled with the magnetic circuit for the purpose of improving the efficiency of plasma generation as explained above. The configuration of the magnetic circuit itself, however, is not the gist of the present invention, so in FIG. 1, the illustration is omitted for simplification. As explained above, however, the disk-shaped conductor plate 19 provided with the magnetic circuit is shown by hatching in FIG. 1 to show that it has a predetermined thickness.

The feature of the present invention lies in the structure and action of the plasma generation antenna 10 as explained above. The antenna 10 is provided at the top of the vacuum chamber 12 for discharge processing and is used for the purpose of emitting high frequency power to the inside space of the vacuum chamber 12. Here, in the explanation of the embodiment, the structure and action of the antenna 10 are the main themes. In the design of the plasma generation antenna 10 constituting the major part of the present invention, the setting of the oscillation frequency of the high frequency power source 31 in the high frequency power feed system 30 is an important requirement. In the present embodiment, in the same way as the document cited above, a high frequency power source able to generate a microwave of 2.45 GHz is used. The output power of the high frequency power source 31 is for example about 2000W.

Figure 2:
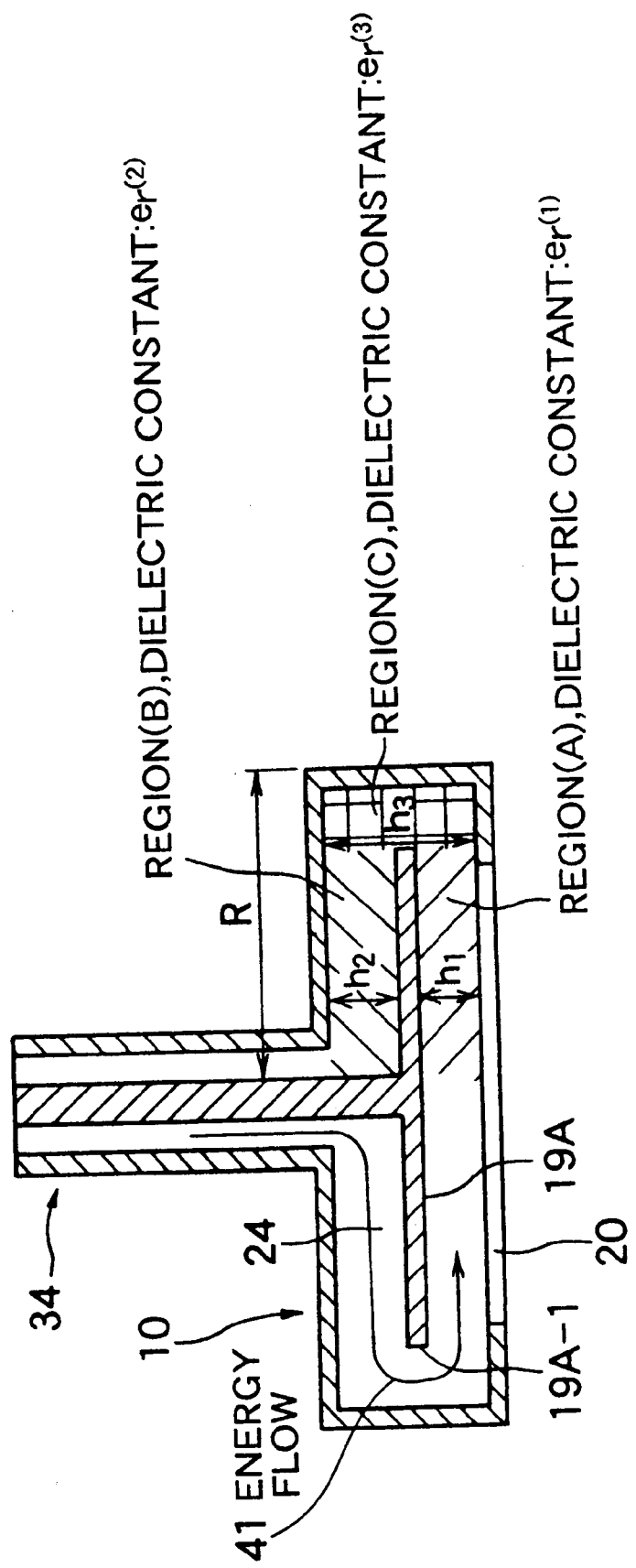
FIG. 2 is a longitudinal sectional view of the basic structure for supplementing the explanation of the structure of a plasma generation antenna of the first embodiment.
Figure 3:
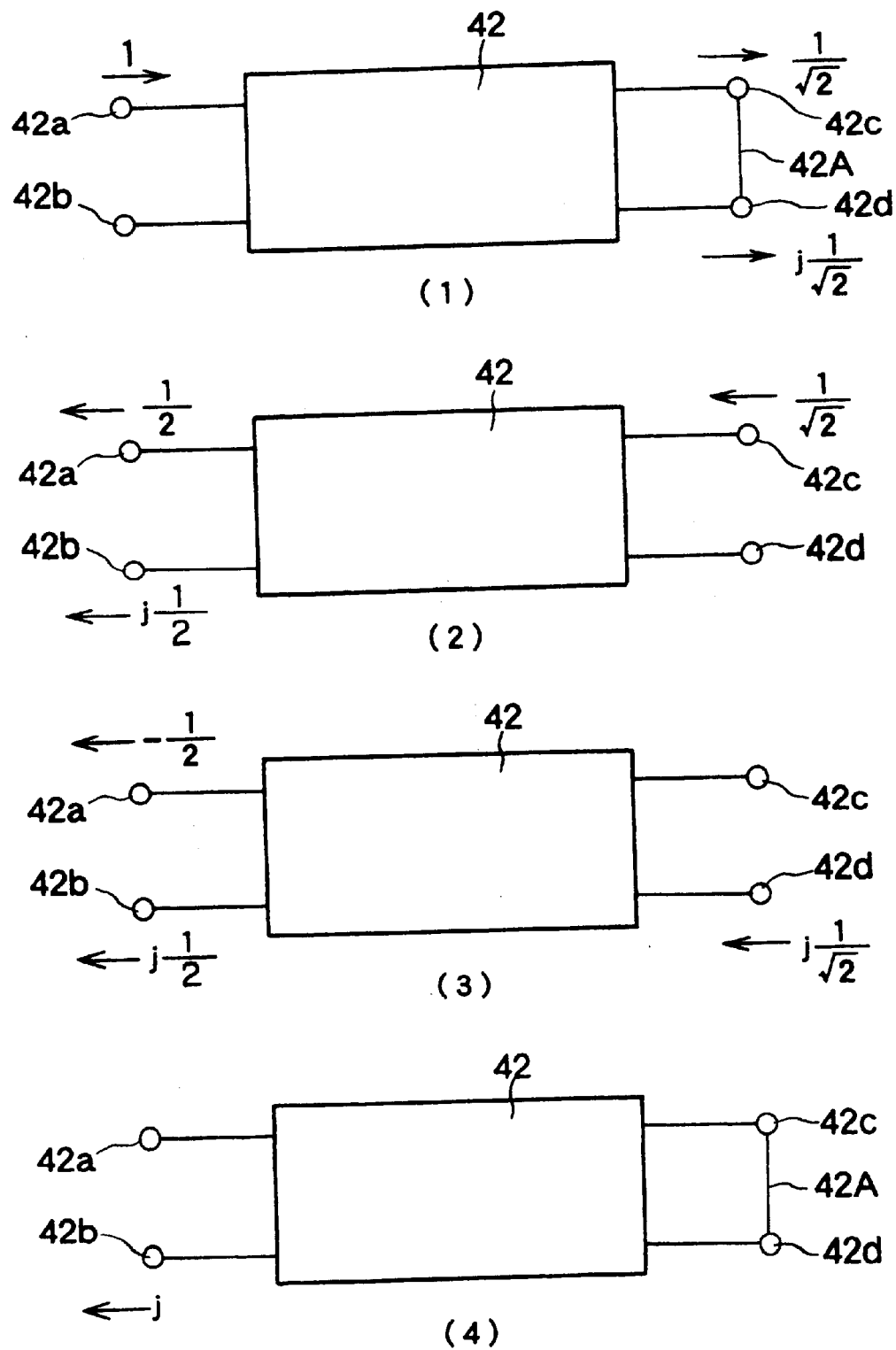
FIG. 3 is a view for explaining the action of the short-circuit 3 dB directional coupler.
Figure 4:
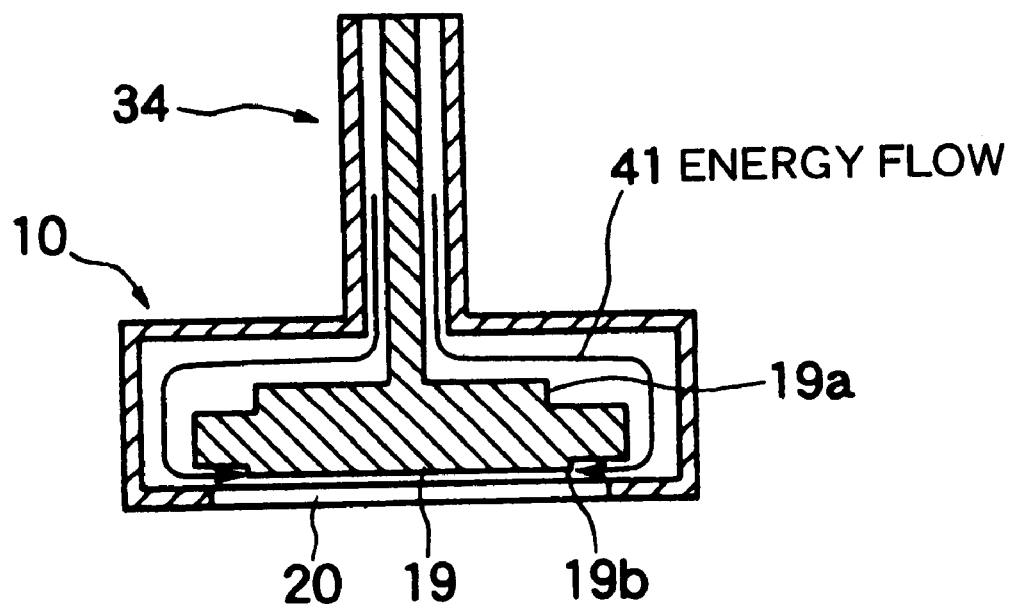
FIG. 4 is a longitudinal sectional view of the practical structure for supplementing the explanation of the structure of the plasma generation antenna of the first embodiment.
Figure 5:
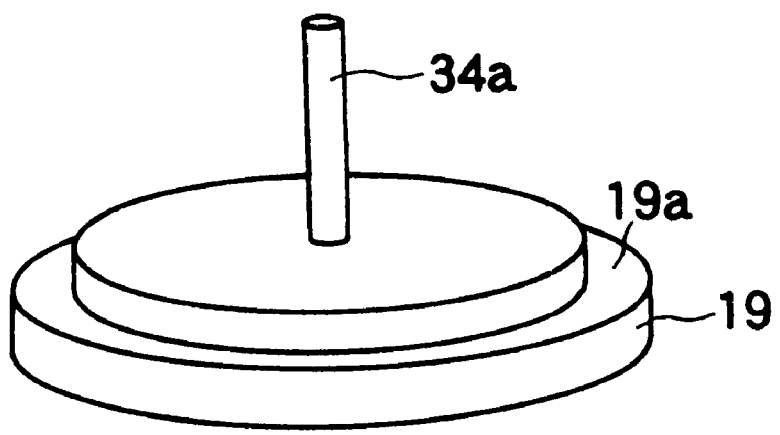
FIG. 5 is a view of the appearance of a disk-shaped conductor plate of the plasma processing antenna of the first embodiment.
Figure 6:
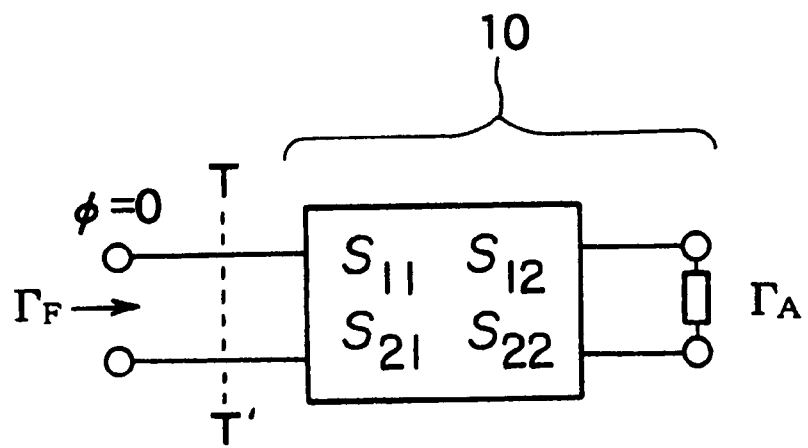
FIG. 6 is a view representing a scattering matrix when viewing the plasma generation antenna as a single power feed system.

Next, the structure and action of the antenna 10 will be explained in detail with reference to FIG. 2 to FIG. 6. FIG. 2 shows schematically the basic structure of the antenna 10, FIG. 3 illustrates the concept of operation of a short-circuit 3 dB directional coupler by, for example, an example of the structure of a rectangular waveguide, FIG. 4 schematically shows the antenna 10 according to the present invention having the function of impedance matching, FIG. 5 shows a perspective view of the appearance of only the disk-shaped conductor plate, and FIG. 6 shows a representation of a scattering matrix (S matrix) when viewing the antenna 10 as a single power feed system.

In FIG. 2, the high frequency power introduced through the high frequency power feed system 30 is guided by the coaxial line 34, passes through the waveguide 24 of the coaxial transmission line formed around the disk-shaped conductor plate 19 of the antenna 10, and is emitted from the rear electromagnetic wave emitter 20 to the space 11 inside the vacuum chamber 12. In this figure, the disk-shaped conductor plate of the antenna 10 is the portion shown by reference numeral 19A. It is shown by a shape different from the above-mentioned conductor plate 19. That is, the conductor plate 19A does not actually have the above predetermined thickness and is drawn schematically as a disk-shaped substantially flat plate. Further, in FIG. 2, the electromagnetic wave emitter 20 designates the opening in the bottom wall. The above high frequency power is the energy for causing discharge of the discharge gas supplied to the space 11 to generate the plasma. In the antenna 10, as shown by the arrow 41 (meaning an energy flow), the high frequency power is supplied to the electromagnetic wave emitter 20 around the peripheral edge 19A-1 of the disk-shaped conductor plate 19A. In this configuration, for the efficient propagation of the high frequency power as shown by the energy flow 41, in the present embodiment, the waveguide 24 of the surrounding region of the disk-shaped conductor plate 19A is given the structure of a short-circuit 3 dB directional coupler, the special property (action) of the short-circuit 3 dB directional coupler is utilized for impedance matching, and the efficiency of propagation is improved, The present embodiment indicates as its features the method of design of the antenna for giving the structure of a short-circuit 3 dB directional coupler by the waveguide 24 of the antenna 10 and the antenna 10 having the structure. The properties of the short-circuit 3 dB directional coupler will be explained in detail below.

Note that in FIG. 2, the waveguide 24 of the portion of propagation of the high frequency power is divided for convenience into three regions (A), (B) and (C). That is, the waveguide 24 for propagation of the high frequency power around the disk-shaped conductor plate 19A is provided with dielectric materials shown as the three regions (A), (B) and (C). In this example, the structure of the short-circuit 3 dB directional coupler is given as explained later using dielectric materials.

Next, an explanation will be given of the special properties of the short-circuit 3 dB directional coupler using (1) to (4) of FIG. 3. In FIG. 3, the short-circuit 3 dB directional coupler is represented by the block circuit 42 provided with the two left ports 42a and 42b and the two right ports 42c and 42d. The top left of the block circuit 42 having the action of the short-circuit 3 dB directional coupler forms an incident end. In the short-circuit 3 dB directional coupler 42, the left ports 42a and 42b are open, while the right ports 42c and 42d are short-circuited and form a short-circuited end 42A.

(1) in FIG. 3 is a view of the case where an electromagnetic wave of a unit amplitude is incident to the top right port 42a of the short-circuit 3 dB directional coupler. The incident wave is divided by the action of the short-circuit 3 dB directional coupler 42 into two waves of amplitudes of $1/\sqrt{2}$ which appear at the short-circuited end 42A. At this time, due to the general properties of the coupler, the amplitude at the top right port 42c becomes $1/\sqrt{2}$, the phase at the bottom right port 42d differs by 90 degrees, and therefore the conjugated amplitude becomes $j(1/\sqrt{2})$.

In the short-circuit 3 dB directional coupler 42, when the incident wave enters the, port 42a as explained above, reflection occurs at the short-circuited end 42A. As shown in (2) and (3) of FIG. 3. the reflection wave again passes through the short-circuit 3 dB directional coupler 42. (2) of FIG. 3 is a view of the case of reflection of the electromagnetic wave of the amplitude $1/\sqrt{2}$ of the port 42c. As a result, this becomes the electromagnetic waves of the conjugated amplitudes ½ and j(½) and appears at the two ports 42a and 42b. On the other hand, (3) of FIG. 3 is a view of the case of reflection of the electromagnetic wave of the conjugated amplitude $j(1/\sqrt{2})$ of the port 42d. Electromagnetic waves of the conjugated amplitudes –½ and j(½) appear at the ports 42a and 42b. Since the overall phenomenon is based on the superposition of (2) and (3) of FIG. 3, in the end, the electromagnetic wave passing through the short-circuit 3 dB directional coupler 42 and reflected at the short-circuited end 42A appears as the conjugated amplitude j at the bottom left port 42b as shown in (4) of FIG. 3. In short, due to the action of the short-circuit 3 dB directional coupler 42, the electromagnetic wave incident from the port 42a of the incident end is output as an electromagnetic wave with an unchanging amplitude and a 90 degrees different phase at the left port 42b. That is, the electromagnetic wave incident to the port 42a is transmitted to the port 42b as an electromagnetic wave shifted in phase by exactly 90 degrees without generation of a standing wave.

If configuring the short-circuit 3 dB directional coupler having the above action by a rectangular waveguide, the port 42a where the electromagnetic wave is incident becomes the incident side waveguide, while the port 42b where the electromagnetic wave is output becomes the emission side waveguide. The portion of the waveguide from the incident side waveguide to the emission side waveguide is formed as a folded portion by the provision of the short-circuit use metal plate portion. If configuring the short-circuit 3 dB directional coupler having a folded portion using the structure of the rectangular waveguide in this way, the high frequency power entering from the incident side waveguide is output from the emission side waveguide without the generation of a standing wave.

The discussion of the short-circuit 3 dB directional coupler relating to the above rectangular waveguide can be expanded and applied to the antenna 10 comprised of the disk-shaped conductor plate 19A and waveguide 24 formed around it, shown in FIG. 2, that is, the antenna 10 having the radial waveguide including the folded portion. The basic operating principle of the short-circuit 3 dB directional coupler 42 relating to the example of the structure using the rectangular waveguide is the same in the antenna 10 of the shape shown in the present embodiment. That is, In the antenna 10, if the generation of the standing wave is eliminated by structural provision (structural realization) of the short-circuit 3 dB directional coupler at the waveguide 24 at the region surrounding the disk-shaped conductor plate 19A, the power of the high frequency wave (microwave) introduced to the incident portion of the top side of the disk-shaped conductor plate 19A is efficiently propagated without generation of loss as shown by the energy flow 41 and is emitted from the electromagnetic wave emitter 20 of the lower, side of the disk-shaped conductor plate 19A In the example of the antenna 10 shown in FIG. 2, the short-circuit 3 dB directional coupler is realized by arranging dielectric materials of the regions (A) to (C) so as to satisfy predetermined conditions at the waveguide 24 formed around the flat disk-shaped conductor plate 19A. Here, the "predetermined conditions" means finding a single scattering matrix S as an overall structure for the waveguide 24 of the antenna 10 and changing the dielectric constants etc. of the dielectric materials of the regions (A) to (C) to make the reflection coefficient $S_{22}$ of the scattering matrix 0. In other words, if the dielectric constants etc. of the dielectric materials are determined so that the reflection coefficient $S_{22}$ of the scattering matrix becomes 0, the short-circuit 3 dB directional coupler is provided at the waveguide 24 by the structure of the dielectric materials of the regions (A) to (C) having those dielectric constants.

Further, since there are various demands in practice on the structure of the plasma/generation antenna 10, it is not possible to employ the above ideal structure as it is. In practice, since a magnetic circuit using permanent magnets is provided close to the electromagnetic wave emitter 20, when the magnetic circuit is contained in the disk-shaped conductor plate 19, the disk-shaped conductor plate 19 is required to have a predetermined thickness in accordance with the housed magnetic circuit as shown in FIG. 1.

Further, similarly, as shown in FIG. 1, the distance between the electromagnetic wave emitter 20 and the disk-shaped conductor plate 19 is in many cases made several mm. Sometimes it has to be made extremely small compared with the distance or clearance at the top side of the disk-shaped conductor plate 19. If such a shape is employed, however, the impedances at the top and bottom surfaces of the disk-shaped conductor plate 19 will become considerably different and therefore microwave reflection will occur.

Therefore, relating to the outside shape of the disk-shaped conductor plate, unlike the flat disk-shaped conductor plate 19A shown in FIG. 2, tie structure shown in FIG. 4 is employed. The disk-shaped conductor plate shown in FIG. 4 is formed to have an impedance matching function so as not to cause microwave reflection by giving a predetermined thickness and making modifications in the outside shape. The outer shape of the disk-shaped conductor plate shown in FIG. 4 is the same as the outer shape of the disk-shaped conductor plate 19 shown in FIG. 1. Therefore, the reference numeral 19 is assigned to the disk-shaped conductor plate shown in FIG. 4 as well. According to this structure, as shown in FIG. 4 and FIG. 5, step differences 19a and 19b are formed at the peripheral edges of the top and bottom surfaces of the disk-shaped conductor plate 19 and the dimensions are suitably designed in accordance with the method of design of the antenna explained below for impedance matching. In this example, by providing step differences 19a and 19b at the top and bottom surfaces of the disk-shaped conductor plate 19 under predetermined conditions, propagation characteristics of the high frequency power the same as the short-circuit 3 dB directional coupler 42 whose operating principle was explained in FIG. 3 are realized. That is, the structure of a short-circuit 3 dB directional coupler is realized by providing the step differences 19a and 19b meeting predetermined conditions at the top and bottom surfaces of the disk-shaped conductor plate 19 of the antenna 10. Here, the "predetermined conditions" means finding one scattering matrix S as an overall structure for the waveguide 24 of the antenna 10 and changing the heights and other dimensions of the step differences 19a and 19b to make the reflection coefficient $S_{22}$ of the scattering matrix 0. In other words, if the heights etc. of the step differences are determined so that the reflection coefficient $S_{22}$ of the scattering matrix becomes 0, the short-circuit 3 dB directional coupler is provided at the waveguide 24 by the structure of the step differences. By providing the step differences 19a and 19b of the predetermined conditions at the top and bottom surfaces of the disk-shaped conductor plate 19 in this way, the impedances are matched, the generation of microwave reflection is prevented, the microwave is efficiently transmitted, and a microwave can be efficiently emitted from the electromagnetic wave emitter 20.

Further, to practically provide the antenna 10 with the disk-shaped conductor plate having the outer shape as shown in FIG. 4 and FIG. 5, it is necessary to change the outer shape of the disk-shaped conductor plate 19 and to consider the selection of the dielectric materials to be arranged around the disk-shaped conductor plate, design of the vacuum sealing, etc. That is, to specifically design the antenna 10, it is necessary to design the microwave propagation path by changing the outer shape of the disk-shaped conductor plate 19 and select the surrounding dielectric materials, design the vacuum sealing, etc. Therefore, the dielectric rings 21 and 23 are arranged around the disk-shaped conductor plate 19 as explained in FIG. 1. The dielectric rings 21 and 23 form the waveguide 24 and serve also as vacuum seals. When designing the antenna 10 of the configuration shown in FIG. 1, the antenna is designed by changing the outer shape by the step differences of the disk-shaped conductor plate 19, selecting the dielectric materials (21, 22, 23) provided at the waveguide 24, etc. and finding one scattering matrix S as the overall structure and changing a certain portion of the structure to give a reflection coefficient $S_{22}$ of the scattering matrix of 0 and thereby realize the structure of the short-circuit 3 cm directional coupler at the waveguide 24 of the antenna.

Next, the method of antenna design relating to the antenna 10 will be described in detail. Here, the process of calculation for realizing a waveguide for propagation of a microwave without reflection is shown for a basic structure obtained by using a material usable for a plasma surface processing system and giving consideration to the mechanical strength.

FIG. 6 is a view for explaining the basic operation of the plasma generation antenna 10. It shows one scattering matrix (S matrix) obtained by viewing the antenna 1 as a single power feed system. The scattering matrix S is comprised of the reflection coefficients $S_{11}$ and $S_{22}$ and the transmission coefficients $S_{12}$ and $S_{21}$. In FIG. 6, when the reflection coefficient of the antenna 10 is $\Gamma_A$ and the scattering matrix of the antenna 10 when viewed as a power feed system is made the following equation (1), the reflection coefficient at the feeding point of the antenna 10 is expressed by the following equation (2):

$$[S] = \begin{pmatrix} S_{11} & S_{12} \\ S_{21} & S_{22} \end{pmatrix} \quad (1)$$

$$\Gamma_F = e^{j2\phi}\Gamma_A - \frac{S'_{22}}{1 - S_{22}\Gamma_A} \quad (2)$$

Note that in equation (2), the symbol * expresses a conjugated complex number and $\phi = \arg(S_{11})$ . . . (3). For simplification, in the representation of the scattering matrix of FIG. 6. the reference plane is moved to the position T—T' where $\phi=0$.

Here, when the reflection coefficient $\Gamma_A$ of the antenna 10 is known, if designing the power feed system so that $S_{22}=\Gamma_A^*$ . . . (4), $\Gamma_F=0$ . . . (5) and complete matching becomes possible.

However, the reflection coefficient $\Gamma_A$ at the antenna 10, that is, the reflection coefficient $\Gamma_A$ at the electromagnetic wave emitter 20, is generally unknown. The above method of calculation cannot be applied. Therefore, in equation (2), the antenna is designed to satisfy $S_{22}=0$ . . . (6). If $S_{11}=0$, $\Gamma_F=\Gamma_A$ . . . (7) stands and the reflection coefficient of the antenna 10 and the reflection coefficient of the feeding point become equal. That is, if ensuring the condition $S_{22}=0$ be satisfied while changing a certain portion of the structure forming the antenna 10, the state of change gives the structure of the short-circuit 3 dB directional coupler and impedance matching is achieved.

Next, the method of finding the elements of the scattering matrix of equation (1) for the plasma generation antenna 10 shown in FIG. 2 as an example will be shown. To facilitate the analysis at this time, the Inside of the cylinder of the inside diameter R (waveguide 24) is divided into three regions (A), (B) and (C) as shown in FIG. 2. The heights $h_1$, $h_2$ and $h_3$ and the dielectric constants $\epsilon_\gamma^{(1)}$, $\epsilon_\gamma^{(2)}$ and $\epsilon_\gamma^{(3)}$ are respectively assigned to these regions. The excitation is made the TM wave and the electromagnetic field is made uniform in the $\phi$ direction. At this time, the electrical component $E_Z$ is obtained by solution of the wave equation in the cylindrical coordinate system shown in equation (8), while the magnetic wave component $H\phi$ is found by equation (9).

$$\frac{\partial^2 E_Z}{\partial \rho^2} + \frac{1}{\rho}\frac{\partial E_Z}{\partial \rho} + k^2 E_X = 0 \quad (8)$$

$$H_\phi = -\frac{1}{j\omega\mu}\frac{\partial E_Z}{\partial \rho} \quad (9)$$

The electromagnetic fields in the region (A), region (B) and region (C) are given by the following equations (10) to (16) in this way:

$$E_r^{(1)} = \frac{H_0^{(2)}(k_0^{(1)}\rho)}{H_0^{(2)}(k_0^{(1)}\gamma)} + \sum_{n=0}^{\infty} A_n^{(1)} \cdot \frac{H_0^{(1)}(k_n^{(1)}\rho)}{H_0^{(1)}(k_n^{(1)}\gamma)} \cos\left(\frac{n\pi}{h_1}z\right) \quad (10)$$

$$H_\phi^{(1)} = \frac{jH_1^{(2)}(k_0^{(1)}\rho)}{Z_0^{(1)}H_0^{(2)}(k_0^{(1)}r)} + j\sum_{n=0}^{\infty} \frac{A_n^{(1)}H_1^{(1)}(k_n^{(1)}\rho)}{Z_n^{(1)}H_0^{(1)}(k_n^{(1)}r)} \cos\left(\frac{n\pi}{h_1}z\right) \quad (11)$$

$$E_z^{(2)} = \sum_{n=0}^{\infty} A_n^{(2)} \frac{H_0^{(1)}(k_n^{(2)}\rho)}{H_0^{(1)}(k_n^{(2)}r)} \cos\left[\frac{n\pi}{h_2}(z-(h_3-h_2))\right] \quad (12)$$

$$H_\phi^{(2)} = j\sum_{n=0}^{\infty} \frac{A_n^{(2)}H_1^{(1)}(k_n^{(2)}\rho)}{Z_n^{(2)}H_0^{(1)}(k_n^{(2)}r)} \cos\left[\frac{n\pi}{h_2}(z-(h_3-h_2))\right] \quad (13)$$

$$E_z^{(3)} = \sum_{n=0}^{\infty} A_n^{(3)} \left[\frac{H_0^{(2)}(k_n^{(3)}\rho)}{H_0^{(2)}(k_n^{(3)}R)} - \frac{H_0^{(1)}(k_n^{(3)}\rho)}{H_0^{(1)}(k_n^{(3)}R)}\right] \cos\left(\frac{n\pi}{h_3}z\right) \quad (14)$$

$$H_\phi^{(3)} = j\sum_{n=0}^{\infty} \frac{A_n^{(3)}}{Z_n^{(3)}} \left[\frac{H_1^{(2)}(k_n^{(3)}\rho)}{H_0^{(2)}(k_n^{(3)}R)} - \frac{H_1^{(1)}(k_n^{(3)}\rho)}{H_0^{(1)}(k_n^{(3)}R)}\right] \cos\left(\frac{n\pi}{h_3}z\right) \quad (15)$$

$$k_n^{(i)} = \sqrt{k_n^2 \varepsilon_r^{(i)} - \left(\frac{n\pi}{h_i}\right)^2}, \quad Z_n^{(i)} = \frac{k_n^{(i)}}{\omega \varepsilon_0 \varepsilon_r^{(i)}}, \quad (i=1,2,3) \quad (16)$$

Here, $A_n^{(1)}$ is an unknown coefficient, $k_n^{(1)}$ is a phase constant, $Z_n^{(1)}$ is a characteristic impedance, and n is a mode number. Further, the first terms on the right sides of equations (10) and (11) correspond to incident waves, the second terms on correspond to reflection waves, and equations (12) and (13) correspond to transmission waves. These must satisfy the boundary condition at $\rho=\gamma$ (following equations (17), (18) and (19)).

$$E_z^{(3)} = \begin{cases} E_z^{(1)}(0 \le z \le h_1) \\ 0(h_1 \le z \le h_3 - h_2) \\ E_z^{(2)}(h_3 - h_2 \le z \le h_3) \end{cases} \quad (17)$$

$$H_\phi^{(1)} = H_\phi^{(3)}(0 \le z \le h_1) \quad (18)$$

$$H_\phi^{(2)} = H_\phi^{(3)}(h_3 - h_2 \le z \le h_3) \quad (19)$$

Here, if equations (10) to (15) are inserted into equations (17) to (19) and the results multiplied with the following equation shown below to integrate them in the range where the boundary conditions stand, equations (20) to (22) are obtained.

$$\cos\left(\frac{m\pi}{h_3}z\right), \cos\left(\frac{m\pi}{h1}z\right), \quad (20)$$

$$\cos\left(\frac{m\pi}{h_2}(z-(h_3-h_2))\right)[h_3 Z_n^{(3)}][S_n](A_n^{(3)}) =$$
$$h_1 Z_0^{(1)}[\varepsilon_n](\alpha_{m0}^{(1)}) + [\varepsilon_n][\alpha_{mn}^{(1)}][h_1 Z_n^{(1)}]$$
$$(A_n^{(1)}) + [\varepsilon_n][\alpha_{mn}^{(2)}][h_2 Z_n^{(2)}](A_n^{(2)})$$

$$(A_m^{(1)}) = I(\delta_n) + [\varepsilon_n][J_n^{(1)}][\alpha_{mn}^{(1)}]^t[C_n](A_n^{(3)}) \quad (21)$$

$$(A_m^{(2)}) = [\varepsilon_n][J_n^{(2)}][\alpha_{mn}^{(2)}]^t[C_n](A_n^{(3)}) \quad (22)$$

Here, the bracketed terms indicate matrixes, while the parenthesized terms indicate column vectors. A term with a single element number such a $[S_n]$ is a diagonal matrix. Note that the elements are given by the following equations (23) to (28):

$$\alpha_{mn}^{(1)} = (-1)^n m\pi \frac{h_1}{h_3} \cdot \frac{\sin\left(m\pi \frac{h_1}{h_3}\right)}{\left(m\pi \frac{h_2}{h_3}\right)^2 - (n\pi)^2} \quad (23)$$

$$\alpha_{mn}^{(2)} = (-1)^{H_2} m\pi \frac{h_2}{h_3} \cdot \frac{\sin\left(m\pi \frac{h_2}{h_3}\right)}{\left(m\pi \frac{h_2}{h_3}\right)^2 - (n\pi)^2} \quad (24)$$

$$S_n = \frac{H_0^{(2)}(k_n^{(3)}r)}{H_0^{(2)}(k_n^{(3)}R)} - \frac{H_0^{(1)}(k_n^{(3)}r)}{H_0^{(1)}(k_n^{(3)}R)} \quad (25)$$

$$C_n = \frac{H_1^{(2)}(k_n^{(3)}r)}{H_0^{(2)}(k_n^{(3)}R)} - \frac{H_1^{(1)}(k_n^{(3)}r)}{H_0^{(1)}(k_n^{(3)}R)} \quad (26)$$

$$J_n^{(i)} = \frac{H_0^{(1)}(k_n^{(i)}r)}{H_1^{(1)}(k_n^{(i)}r)}, (i=1,2) \quad (27)$$

$$\varepsilon_n = \begin{cases} 1(n=0) \\ 2(n \ne 0) \end{cases}, \delta_n = \begin{cases} 1(n=0) \\ 0(n \ne 0) \end{cases} \quad (28)$$

Here, I is expressed by the following equation (29):

$$I = \frac{H_1^{(2)}(k_0^{(1)}r)H_0^{(1)}(k_0^{(1)}r)}{H_0^{(2)}(k_0^{(1)}r)H_1^{(1)}(k_0^{(1)}r)} \quad (29)$$

If equations (21) and (22) are inserted into equation (20), the following equation (30) is obtained.

$$[[h_3 Z_n^{(3)}][S_n] - [\varepsilon_n][\alpha_{mn}^{(1)}][h_1 Z_n^{(1)}][\varepsilon_n][J_n^{(1)}][\alpha_{mn}^{(1)}]^t[C_n] - \quad (30)$$
$$[\varepsilon_n][\alpha_{mn}^{(2)}][h_2 Z_n^{(2)}][\varepsilon_n][J_n^{(2)}][\alpha_{mn}^{(2)}]^t[C_n]](A_n^{(3)})$$
$$= (1+I)h_1 Z_0^{(1)}[\varepsilon_n](\alpha_{m0}^{(3)})$$

By solving equation (30) for $A_m^{(3)}$ and inserting the result into equations (21) and (22), $A_m^{(1)}$ and $A_m^{(2)}$ are found. In the end, the elements $S_{11}$, $S_{12}$ and $S_{21}$ of the scattering matrix are given by the following equations (31) and (32):

$$S_{11} = A_0^{(1)} \sqrt{-\frac{H_1^{(1)}(k_0^{(1)}r)H_0^{(2)}(k_0^{(1)}r)}{H_0^{(1)}(k_0^{(1)}r)H_1^{(2)}(k_0^{(1)}r)}} \quad (31)$$

$$S_{12} = S_{21} = A_0^{(2)} \sqrt{-\frac{h_2 Z_0^{(2)} H_1^{(1)}(k_0^{(2)}r)H_0^{(2)}(k_0^{(1)}r)}{h_1 Z_0^{(1)} H_0^{(1)}(k_0^{(2)}r)H_1^{(2)}(k_0^{(1)}r)}} \quad (32)$$

Using the unitary property, $S_{22}$ is obtained by the following equation (33):

$$S_{22} = -\frac{S_{21}}{S_{21}^*} S_{11}^* \quad (33)$$

By suitably changing a certain portion of the plurality of variables (heights $h_1$, $h_2$ and $h_3$ and dielectric constants $\varepsilon_\gamma^{(1)}$, $\varepsilon_\gamma^{(2)}$ and $\varepsilon_\gamma^{(3)}$) in $S_{22}$ obtained by equation (33), it is possible to provide the structure of the short-circuit 3 dB directional coupler at the antenna 10. In this way, it is possible to obtain elements of the scattering matrix relating to the plasma generation antenna 10 shown in FIG. 2 and possible to use the reflection coefficient $S_{22}$ among these to precisely find the dimensions or dielectric constants etc. of the parts of the antenna 10 enabling impedance matching.

It is also possible to use the same method of design as above for analysis to find the elements of the scattering matrix in the design of the antenna 10 having the disk-shaped conductor plate 19 formed with the step differences 19a and 19b shown in FIGS. 4 and 5. That is, the antenna is designed by multi variable analysis using as variables the distance between the peripheral edge of the disk-shaped conductor plate and the outer vessel, the heights of the step differences, the distance between the peripheral edge of the disk-shaped conductor plate and the walls of the step differences, and the distance between the bottom surfaces of the step differences and the outer vessel. In this way, it is possible to precisely find the dimensions etc. of the step differences of the antenna 10 able to perform impedance matching using the reflection coefficient $S_{22}$ of the scattering matrix even for the plasma generation antenna 10 shown in FIG. 4 etc.

Figure 7:
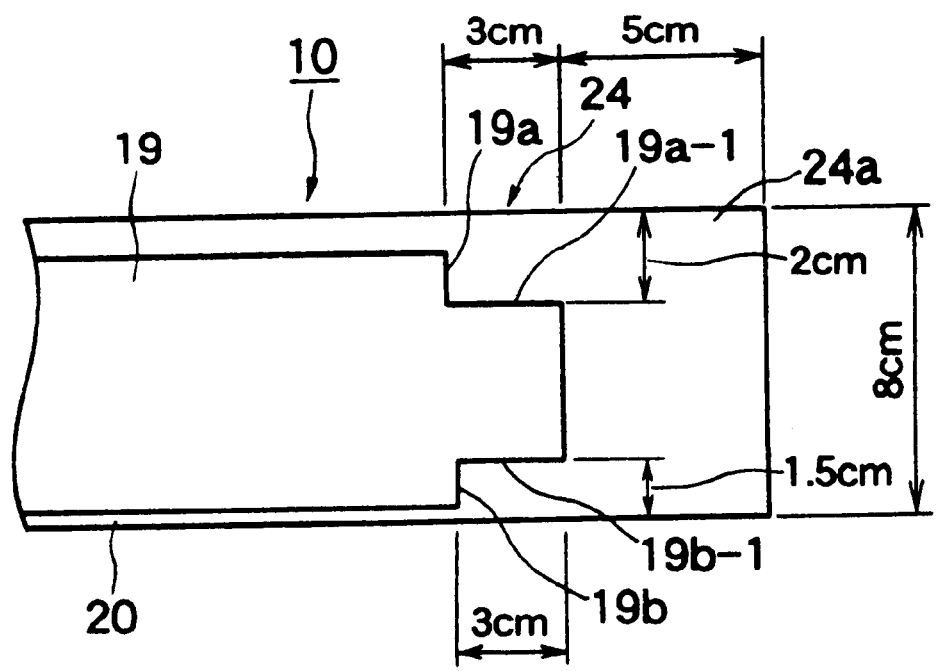
FIG. 7 is a longitudinal sectional view of key parts of a plasma generation antenna designed applying this antenna design technique in the first embodiment of the present invention.

An example of the folded portion around the peripheral edge of the disk-shaped conductor plate 19 designed in the above way for the plasma generation antenna 10 having the step differences 19a and 19b shown in FIG. 4 is shown in FIG. 7. The antenna 10 shown in FIG. 7 is designed so that the reflection coefficient $\Gamma_F$ at the feeding point of the antenna 10 deemed to be the power feed system matches with the reflection coefficient $\Gamma_A$ at the electromagnetic wave emitter of the antenna 10. In FIG. 7 the reference numeral 19 indicates the disk-shaped conductor plate of the antenna 10, while 24a is a conductive outside vessel. The step difference 19a is formed on the top sur ace of the disk-shaped conductor plate 19, while the step difference 19b is formed on the bottom surface. The above waveguide 24 is formed between the outside vessel 24a and the disk-shaped conductor plate 19 positioned inside it. The dimensions of the parts of the antenna 10 are as follows. The height of the outside vessel 24a is 8 cm. The distance between the maximum diameter portion (peripheral edge) positioned at the center of the disk-shaped conductor plate 19 in the thickness direction and the cylindrical side walls of the outside vessel 24a is 5 cm. The dimension of width of the step difference 19a in the diametrical direction is 3 cm, while the dimension from the surface (bottom surface) 19a-1 in the step difference 19a to the upper wall of the outside vessel 24a is 2 cm. The dimension of width of the step difference 19b in the diametrical direction is 3 cm, while the dimension from the surface (bottom surface) 19b-1 in the step difference 19b to the bottom wall of the outside vessel 24a is 1.5 cm.

According to the antenna 10 designed so that the reflection coefficient $\Gamma_A$ and the reflection coefficient $\Gamma_F$ of the waveguide 24 match as explained above, by inserting three stub tuners into the above coaxial line 34, it is possible to even more easily match the impedance. Note that at this time, the coaxial waveguide converter 33 must be designed to be able to substantially completely match the impedance at the frequency used, that is 2.4 GHz.

Further, as a result of actual measurement, when it becomes clear that the reflection coefficient $\Gamma_A$ is large, it is sufficient to insert that value into equation (4) and redesign the plasma generation antenna. By applying this technique to the design of a plasma generation antenna, it is possible to construct a plasma processing system which improves the efficiency of transmission of electromagnetic waves in the antenna power feed system, a problem in the past, and has advantages never seen in the past. These advantages are the following (1) to (3):

(1) A plasma processing system which can emit a large power electromagnetic wave impossible in the past, and can generate higher density plasma than ever before can be provided.

(2) Plasma of the same extent of density as in the past can be generated using a smaller power than in the past, so the plasma processing system can be given a smaller power source and be made smaller in energy consumption. Further, the rate of increase of the power for dealing with the increasing size of plasma generation areas accompanying the processing of large area substrates can be suppressed.

(3) The method of design of an antenna according to the present embodiment defines the structure of the electromagnetic wave transmission path. Optimal design assuming any shape or material for the desired process becomes possible.

Note that the design shown in the first embodiment is one example of the result of calculations. It is of course possible to calculate other efficient structures using similar calculations. Due to the above reasons, according to the plasma generation antenna 10 according to the above embodiment, it is possible to minimize the power loss in the inside of the plasma generation antenna and possible to realize a plasma generation system of a higher efficiency than ever before.

Next, the routine and features when processing the surface of a substrate 14 by using the plasma processing system according to the first embodiment will be explained in brief. The surface processing is for example a dry etching process of a silicon oxide film on a silicon wafer.

In the plasma processing system according to the first embodiment, discharge gas is supplied from the discharge gas introduction mechanism 16 through the gas introduction pipe 15 to the vacuum chamber 12. As the discharge gas used in the dry etching process of a silicon oxide film, generally use is made of a mixed gas comprised mainly of a chlorofluorocarbon gas plus argon, oxygen, hydrogen, etc. On the other hand, the evacuating mechanism 18 provided at the vacuum chamber 12 is provided with a hydraulic rotary pump or turbo molecular pump or other vacuum pump. The inside of the vacuum chamber 12 is evacuated through the evacuation port 17 until reaching for example a pressure of about $10^{-4}$ Pa. Note that the vacuum chamber 12 is also provided with a gate valve for loading and unloading the substrates 14 and a transport system for loading and unloading the substrates 14 through the gate valve, but illustration of these is omitted in FIG. 1.

Next, an explanation will be given of the operation of the above plasma processing system. First, the not shown transport system is used to load the substrate 14 into the vacuum chamber 12 and place it on the substrate holder 13. The evacuating mechanism 18 is then operated to evacuate the inside of the vacuum chamber 12 to about $10^{-4}$ Pa, then the discharge gas introduction mechanism 16 introduces the discharge gas into the vacuum chamber 12. The pressure of the gas inside the vacuum chamber 12 is determined by the flow rate of introduction of the gas and the evacuation rate of the evacuating mechanism 18. The typical gas pressure in the plasma processing system of the present embodiment is about 1 Pa. To maintain the predetermined discharge pressure at the predetermined gas flow rate the general practice has been to provide the evacuating mechanism 18 with a mechanism for controlling the evacuation rate.

Next, the high frequency power feed system 30 operates to supply high frequency power to the vacuum chamber 12. That is, the high frequency power generated from the high frequency power resource 31 is guided by the waveguide to the stub tuner 32 where the impedance is matched, then is converted by the coaxial waveguide converter 33 and is supplied through the coaxial line 34 to the plasma generation antenna 10. The high frequency power supplied to the antenna 10 is emitted from the electromagnetic wave emitter 20 to the space 11 in accordance with the action of the antenna 10 to electrically dissociate the discharge gas in the space 11 and cause discharge. Plasma is generated in the space 11 inside of the vacuum chamber 12 by this discharge. This plasma is used for the predetermined processing of the surface of the substrate 14 on the substrate holder 13.

In the above plasma processing system, the features of the antenna 10 were used to enable generation of high density plasma, which had been impossible in the past. The uniformity of the plasma is within ±3% in the case of a diameter in the range of 300 mm. This value is sufficient for a plasma processing system using current silicon substrates. Further, from the features of the plasma generation antenna 10, it becomes easy to generate uniform plasma by a larger area. The antenna can therefore be applied to a system for processing of a large-sized substrate of a diameter of 400 mm or a diameter of 450 mm in the future.

Figure 8:
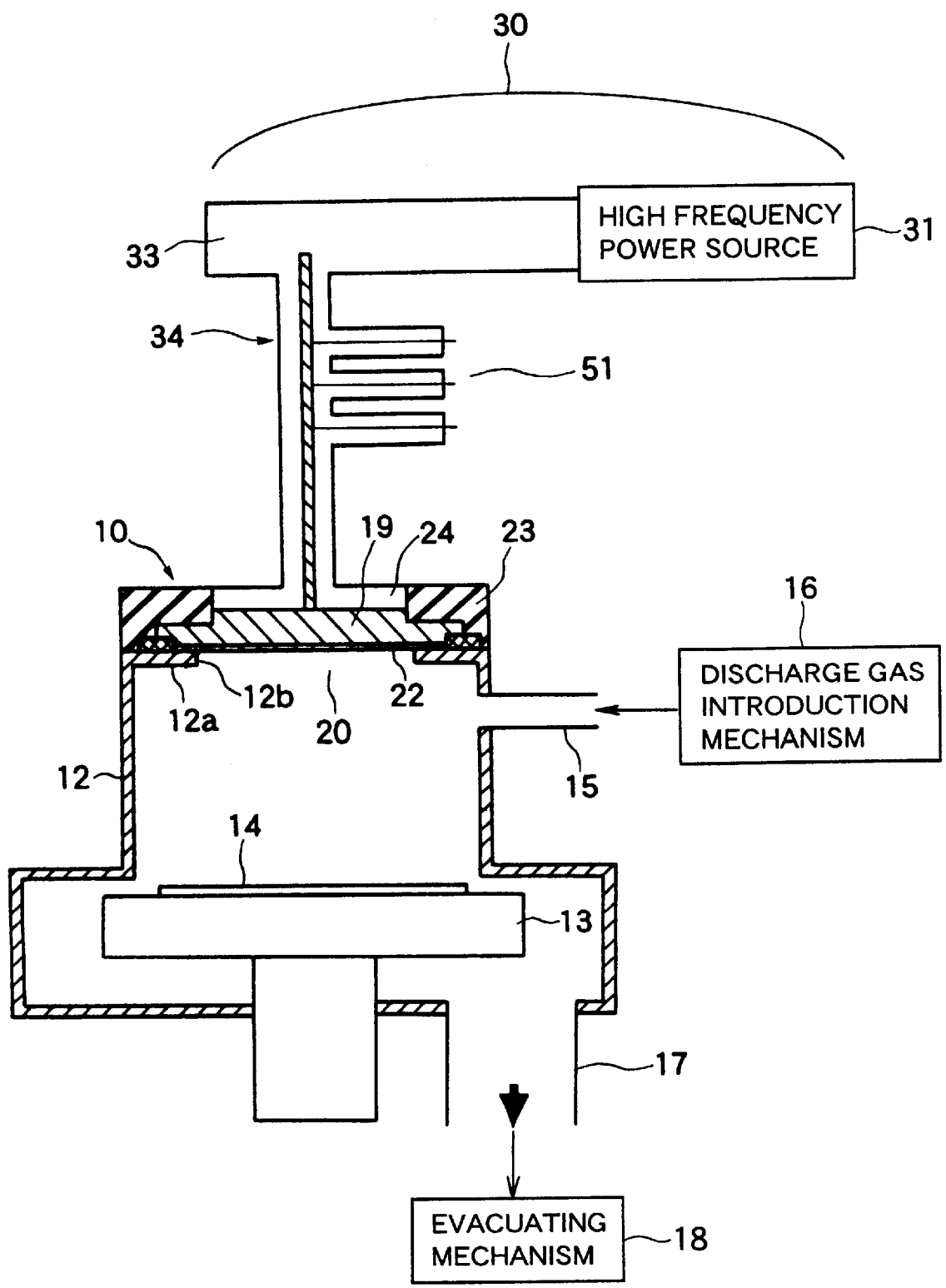
FIG. 8 is a longitudinal sectional view of a plasma generation apparatus according to a second embodiment of the present invention.
Figure 9:
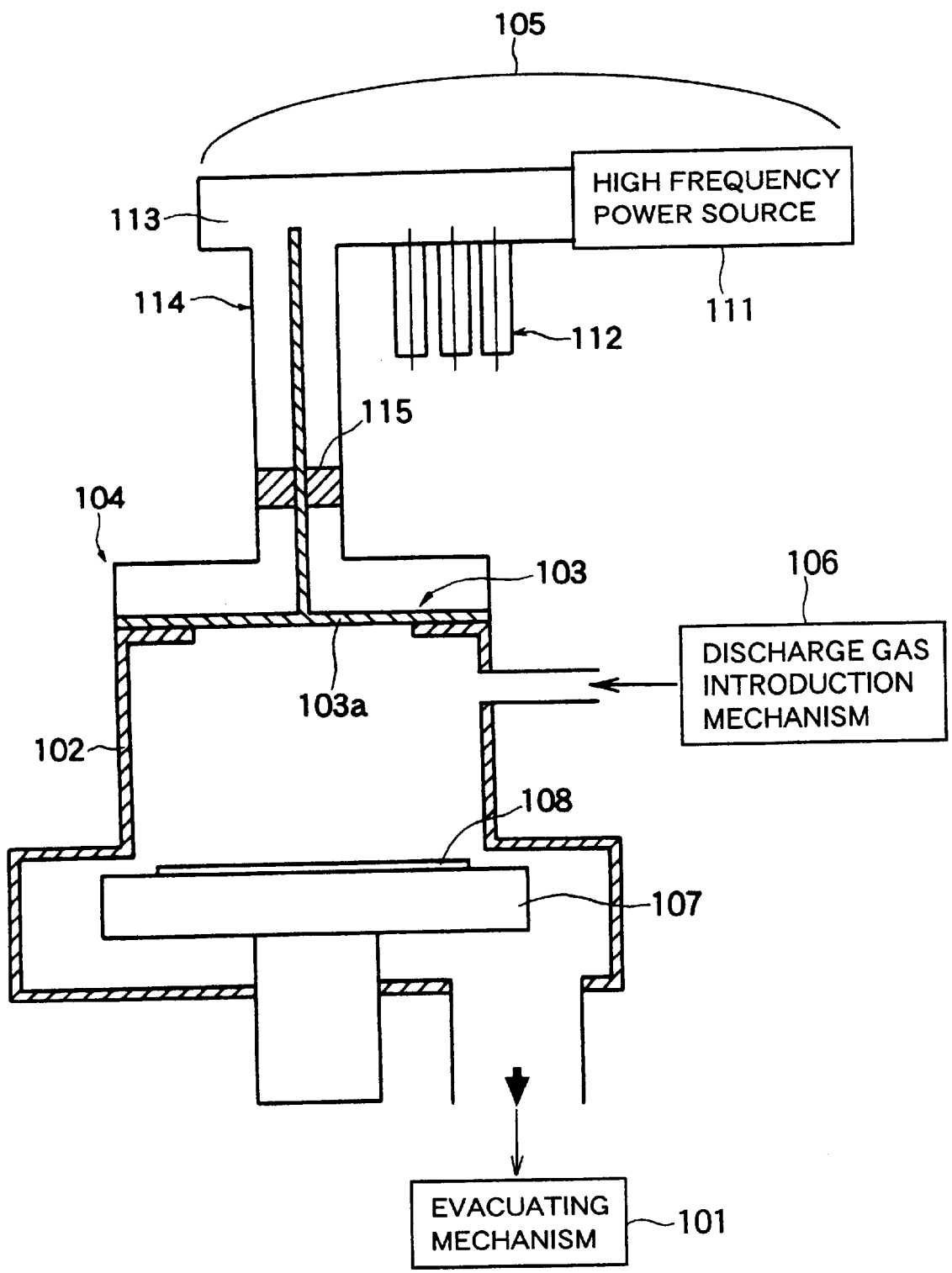
FIG. 9 is a longitudinal sectional view schematically showing a plasma processing system of the related art.

FIG. 8 shows a second embodiment of the present invention and is similar to FIG. 1. In FIG. 8, the same reference numerals are assigned to elements substantially the same as the elements explained in FIG. 1 and explanations are omitted. In particular, the structure providing the short-circuit 3 dB directional coupler of the plasma generation antenna 10 in this embodiment is substantially the same as that explained in the first embodiment. In the present embodiment, matching even closer to the ideal can be realized by providing a coaxial stub tuner 51 in the coaxial line 34.

In the antenna 10 optimally designed in accordance with the first embodiment, the design is based on the presumption that the reflection coefficient of the electromagnetic wave emitter is sufficiently small or known. The impedance of the plasma generated however changes somewhat according to the input power, gas pressure, etc., so the reflection coefficient also changes somewhat in accordance with the impedance of the plasma. The plasma source shown in the first embodiment is an ECR plasma source provided with a magnetic circuit at the disk-shaped conductor plate 19 of the antenna 10 and using the magnetic field as explained above. In this case, the change of the impedance is small, but when applying the present invention to a plasma source of the type generating plasma without using the magnetic field, the change of the reflection coefficient sometimes becomes a problem. Therefore, to eliminate the reflection wave caused in the waveguide in the antenna 10 due to the change of the impedance of the plasma, the coaxial stub tuner 51 is added to the coaxial line 34 for supplying high frequency power to the antenna 10. By adding this configuration, it is possible to cancel out the reflection wave generated due to the change of the reflection coefficient by the standing wave generated by the coaxial stub tuner 51 and realize a completely matched state without relying on a change of the process conditions.

The structure of the plasma generation antenna 10 used for the plasma processing system according to the present invention is not limited to the above embodiment. If the conditions sought for the above short-circuit 3 dB directional coupler are satisfied, it is possible to freely change the shape and material of the dielectric rings and blocks, the outer diameter and thickness of the disk-shaped conductor plate, the shapes of the step differences, and other dimensions, since the application of the plasma generation antenna designed by the system of the present invention is a plasma source for a semiconductor manufacturing system, due to the wavelength of the electromagnetic wave, it is preferable to set the frequency used to a range of 0.5 to 10 GHz. Further, by designing the antenna predicated on use at a frequency of 0.915 GHz or 2.45 GHz for which use is permitted as an industrial frequency, it is possible to realize a more practical plasma generation antenna.

In the above embodiments, the example was shown of the use of the plasma processing system according to the present invention to dry etching, but the object of the present invention lies in generating plasma efficiently and with a good uniformity using a high frequency wave as explained above. Therefore, even when applying the invention to a plasma processing system meant for all types of surface processing using plasma such as plasma CVD, plasma oxidation, and plasma polymerization, the same effect as explained in the embodiments can be obtained. While the invention has been described by reference to specific embodiments chosen for purposes of illustration, it should be apparent that numerous modifications could be made thereto by those skilled in the art without departing from the basic concept and scope of the invention.

What is claimed is:

1. A plasma processing system comprising:

a vacuum chamber in which plasma is generated in a space at the front of a substrate loaded inside, an antenna for plasma generation provided in said vacuum chamber, a high frequency power source for supplying high frequency power to said antenna, wherein said antenna supplied with the high frequency power from said high frequency power source emitting the high frequency power to cause generation of plasma in the space in said vacuum chamber and the plasma being used to perform predetermined processing of the surface of said substrate, and further wherein, said antenna having a disk-shaped conductor having a predetermined thickness and an electromagnetic wave emitter facing said substrate and being connected to said high frequency power source by a coaxial line, said disk-shaped conductor being connected to an inside conductor of said coaxial line at its center point, a waveguide of a coaxial type arranged symmetrically with respect to the center point and provided with a folded portion from said coaxial line to said electromagnetic wave emitter being provided around said disk-shaped conductor, and said folded portion of said waveguide having structure as a short-circuit 3 dB directional coupler having an impedance matching action.

2. A plasma processing system as set forth in claim 1, wherein the structure as said short-circuit 3 dB directional coupler is produced by forming a step difference at one or both of the top surface and bottom surface of said disk-shaped conductor.

3. A plasma processing system as set forth in claim 1, wherein the structure as said short-circuit 3 dB directional coupler is produced by providing dielectric materials at the waveguide around said disk-shaped conductor.

4. A plasma processing system as set forth in claim 1, wherein in said antenna, the variables of any elements in the plurality of elements comprising the structure as said short-circuit 3 dB directional coupler are determined to give $S_{22}=\Gamma_A^*$ (where "*" is a conjugated complex number) in a representation of a scattering matrix with respect to a reflection coefficient $\Gamma_A$ of said antenna.

5. A plasma processing system as set forth in claim 1, wherein in said antenna, the variables of any elements in the plurality of elements comprising the structure as said short-circuit 3 dB directional coupler are determined to give $S_{22}=0$ in a representation of a scattering matrix.

6. A plasma processing system as set forth in claim 1, wherein a magnetic circuit for generating a magnetic field in the space is provided at said disk-shaped conductor.

7. A plasma processing system as set forth in claim 6, wherein the flux density of the magnetic field generated by said magnetic circuit in a region in proximity to said disk-shaped conductor in the space is set so that the electron cyclotron frequency corresponding to the flux density becomes larger than the frequency of the high frequency power.

8. A plasma processing system as set forth in claim 1, wherein the frequency of the high frequency power is 0.5 to 10 GHz.

9. A plasma processing system as set forth in claim 1, wherein a coaxial type impedance matching mechanism is provided at said coaxial line.

* * * * *